(12) United States Patent
Weber et al.

(10) Patent No.: US 8,040,689 B2
(45) Date of Patent: Oct. 18, 2011

(54) SUPPORT TABS FOR PROTECTING A CIRCUIT BOARD FROM APPLIED FORCES

(75) Inventors: Douglas Joseph Weber, Arcadia, CA (US); Pinida Jan Moolsintong, San Francisco, CA (US); Stephen Brian Lynch, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/791,610

(22) Filed: Jun. 1, 2010

(65) Prior Publication Data
US 2010/0265676 A1   Oct. 21, 2010

Related U.S. Application Data

(62) Division of application No. 11/519,387, filed on Sep. 11, 2006, now Pat. No. 7,751,199.

(51) Int. Cl.
*H05K 7/02* (2006.01)
*H05K 7/04* (2006.01)
(52) U.S. Cl. .................. 361/807; 361/810; 361/720
(58) Field of Classification Search .......... 361/807, 361/810, 760, 748, 720
See application file for complete search history.

(56) References Cited

U.S. PATENT DOCUMENTS

| | | | |
|---|---|---|---|
| 4,701,984 A | 10/1987 | Wyckoff | |
| 5,038,250 A | 8/1991 | Uenaka et al. | |
| 5,477,420 A | 12/1995 | Brooks | |
| 5,481,434 A * | 1/1996 | Banakis et al. | 361/756 |
| 5,485,672 A | 1/1996 | Carpenter et al. | |
| 5,893,466 A | 4/1999 | May et al. | |
| 6,428,338 B1 | 8/2002 | Yasufuku et al. | |
| 6,434,010 B1 | 8/2002 | Hsu | |
| 7,048,564 B1 | 5/2006 | Hinze | |

\* cited by examiner

*Primary Examiner* — Hung S Bui
(74) *Attorney, Agent, or Firm* — Kramer Levin Naftalis & Frankel LLP

(57) ABSTRACT

The present invention can relate to an electronic device having one or more support tabs that protect a circuit board disposed inside the device from externally applied compressive forces. In particular, when a force is applied to a housing of the device, the support tabs can buttress the housing of the device, either directly or through other intervening components disposed within the device, to reduce the likelihood that the housing or intervening components will contact and damage the circuit board. The present invention also can relate to methods for manufacturing such an electronic device.

22 Claims, 14 Drawing Sheets

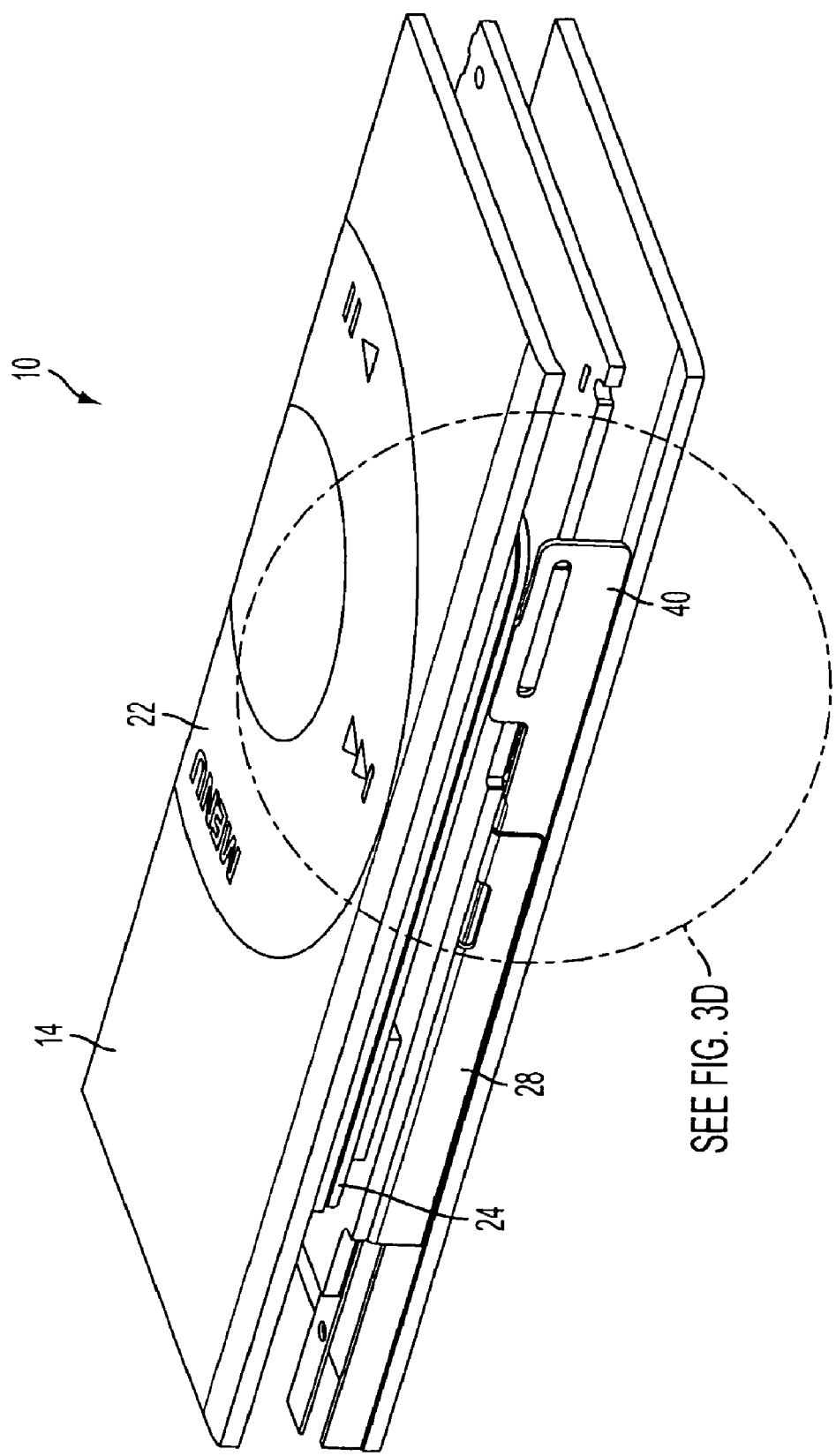

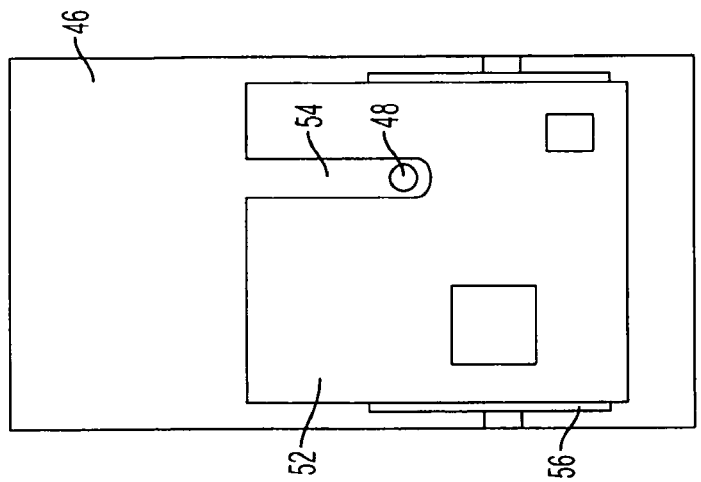
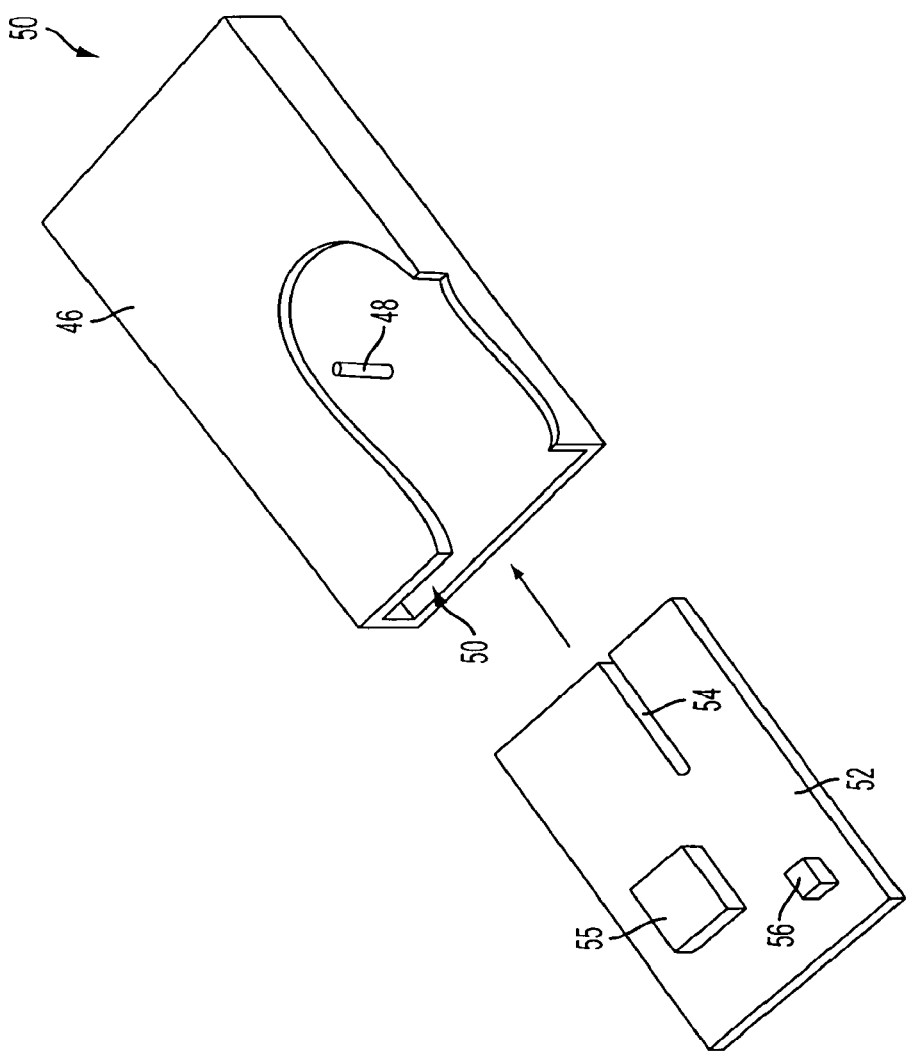

SUPPORT TABS FOR PROTECTING A CIRCUIT BOARD FROM APPLIED FORCES

CROSS-REFERENCE TO RELATED APPLICATION

This is a divisional of copending, commonly-assigned U.S. patent application Ser. No. 11/519,387, filed Sep. 11, 2006.

FIELD OF THE INVENTION

The present invention can relate to methods and apparatus for supporting a circuit board and protecting the circuit board from applied compressive forces.

BACKGROUND OF THE INVENTION

Circuit boards disposed inside of consumer electronics are often fragile. As products get smaller and thinner, the distance between the circuit board and the housing of the electronic device is therefore often reduced. In this case, circuit boards may become more susceptible to damage, particularly from externally applied forces having components that are normal to the plane of the circuit boards. For example, such forces may be applied when the electronic device is placed inside a user's pocket or when the user repeatedly presses buttons on the electronic device.

When an external normal force is applied to an electronic device in which the distance between the circuit board and the housing is small, the inside wall of the housing or components disposed between the housing and the circuit board can come into contact with the circuit board (and components disposed on the circuit board) and cause damage. Also, repetitive strain on the circuit board may cause components attached to the board to detach, e.g., from failure of solder connections of a BGA (Ball Grid Array). These failures can result in failure of the product to function, which in turn results in field returns.

SUMMARY OF THE INVENTION

It is an object of the present invention to provide methods and apparatus for supporting a circuit board and protecting the circuit board from externally applied forces.

In accordance with the present invention, an electronic device is provided that can have one or more support tabs disposed therein. Each support tab can be disposed substantially orthogonal to a circuit board in the electronic device. Some support tabs can traverse holes or slots disposed through the circuit board. Each tab can buttress the housing of the device when a compressive force is applied, thereby protecting the circuit board. That is, each tab can reduce the likelihood that the housing of the electronic device will contact and potentially damage the circuit board.

Each tab may be disposed on a frame to which the circuit board is assembled. Each tab also may be disposed on another structure of the electronic device, such as the housing of the electronic device.

When the electronic device is fully assembled, one or more tabs may be disposed within or near the central region of the circuit board or electronic device. One or more additional tabs may be disposed on or near the edges of the circuit board or electronic device.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which:

FIG. 3C illustrates another section view of the electronic device of FIG. 1A, incorporating one embodiment of the present invention;

FIGS. 4A and 4B illustrate a second embodiment of the present invention;

DETAILED DESCRIPTION OF THE INVENTION

Figure 1A:
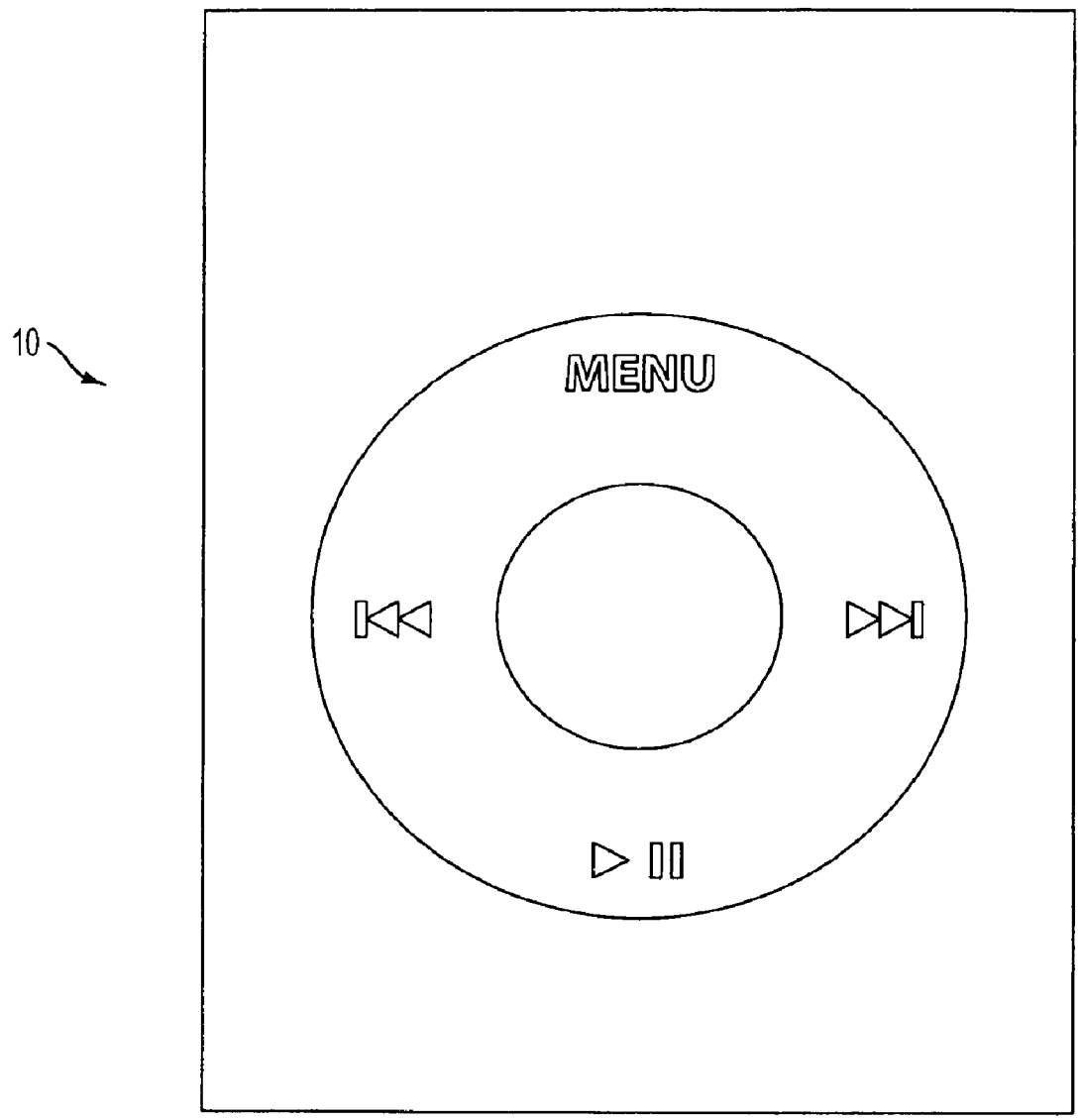
FIG. 1A illustrates an exemplary electronic device that can incorporate the present invention.

FIG. 1A illustrates an exemplary electronic device that can incorporate the present invention. Electronic device 10, e.g., an iPod.™ sold by Apple Computer, Inc. of Cupertino, Calif., can be a hand-held consumer electronic device having circuit board 12 (see FIG. 1B) disposed therein. As device 10 is designed to be smaller and thinner, the distance between circuit board 12 and an inner surface of housing 14 of device 10 can become increasingly smaller. This can cause circuit board 12 to become increasing susceptible to damage from compressive force F applied to device 10 during use, e.g., when a user presses buttons on electronic device 10.

Figure 1B:
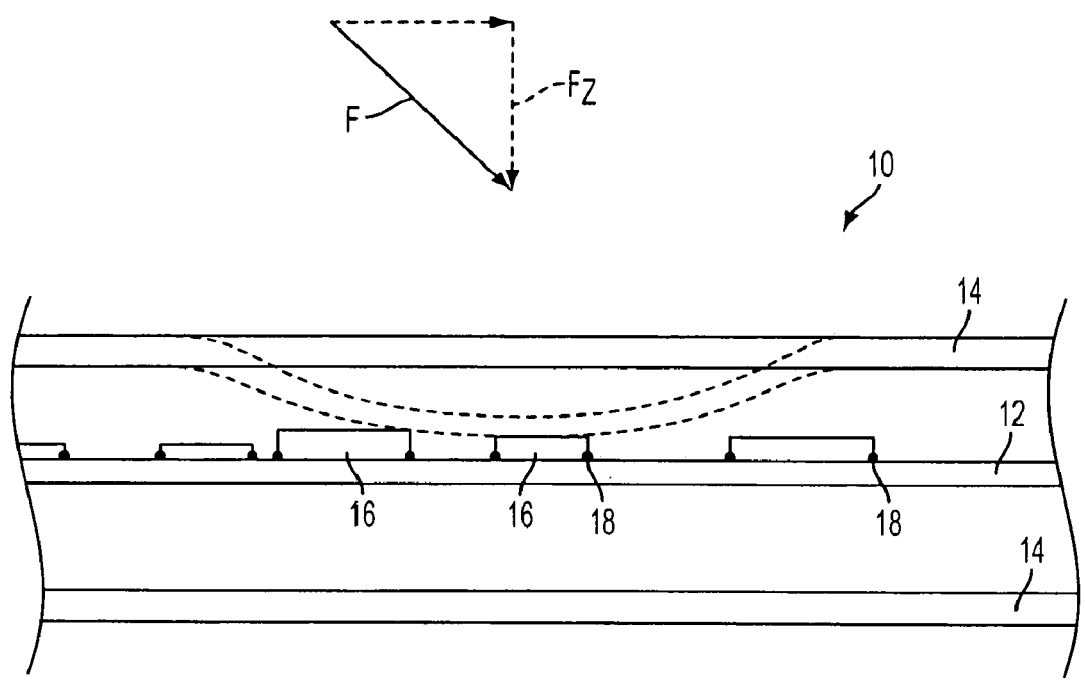
FIG. 1B illustrates the damage that the electronic device can sustain when subjected to a compressive force.

FIG. 1B illustrates what can occur when force F is applied externally to device 10. Depending on the magnitude and angle of applied force F, normal component Fz of force F can cause housing 14 to deform and contact circuit board 12 (including components 16 disposed on the circuit board). If normal component Fz is strong enough, it can damage circuit board 12 and components 16 (e.g., by shorting out electronic circuits or breaking the board). Repetitive strain on circuit board 12 may cause solder joints 18 to fail. As used herein, the term "circuit board" includes, among other things, the electronic components disposed thereon.

One of skill in the art will understand that FIG. 1B provides an illustration of certain modes of damage. Other modes of damage also may result from applied force F. Also, while FIG. 1B illustrates contact between housing 14 of device 10 and circuit board 12, device 10 also can incorporate other intervening components between the housing and the circuit board. When a compressive force is applied to the housing, that force can be transmitted to the intervening components and can cause similar modes of damage.

The present invention can reduce the risk of damage to the circuit board by reducing the likelihood that the housing of the electronic device or the intervening components will contact the circuit board when an external force is applied to the housing. The present invention can accomplish this by incorporating one or more support tabs disposed to resist the normal component of the applied force. Thus, when an external force having a normal component is applied to the electronic device, each tab can buttress the housing of the electronic device (either directly or through one or more intervening components). This reduces the likelihood that the housing will deform sufficiently to damage the circuit board.

Figure 2:
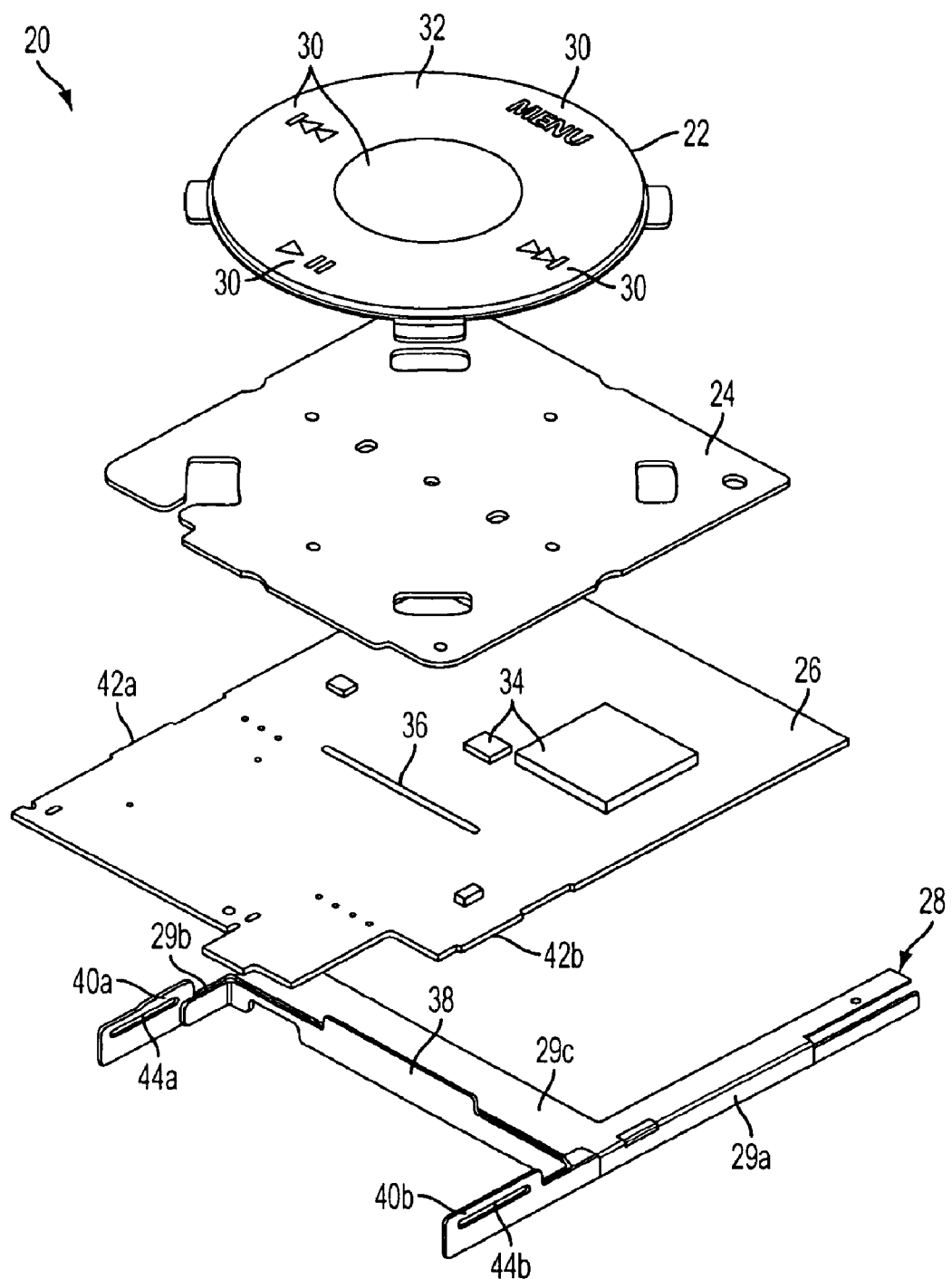
FIG. 2 illustrates an exploded view of some components of the electronic device of FIG. 1A, incorporating one embodiment of the present invention.

FIG. 2 shows a first embodiment of the present invention. Assembly 20 can include user input component 22, stiffener plate 24, circuit board 26, and frame 28.

User input component 22 can provide an interface for a user to input information into the electronic device. In one embodiment of the present invention, user input component 22 may be a trackwheel similar to that used by the iPod.™. The trackwheel can include one or more buttons for selecting software entries and a capacitive touchpad. The touchpad may permit a user to scroll through software menus. In alternative embodiments, user input component 22 may include, for example, one or more buttons, a touchpad, a touchscreen display, electronics for accepting voice commands, antennas, infrared ports, or combinations thereof.

Stiffener plate 24 can provide increased structural integrity to the electronic device, particularly in an area that may receive increased strain from a user interacting with user input component 22. User input component 22 may be coupled to stiffener plate 24, which in turn may be attached to an inside surface of housing 14 or another structure.

In one embodiment of the present invention, frame 28 can have first and second side struts 29a and 29b coupled by central strut 29c. Central support tab 38 can be disposed on the central strut. In one embodiment of the present invention, the central support tab is centered on the central strut. In alternative embodiments, the central support tab can be disposed in another location on the central strut. In alternative embodiments, frame 28 also can include additional struts or less struts depending on the configuration of the components inside the electronic device.

Circuit board 26 may be configured to be assembled to frame 28, which may or may not be affixed to the housing of the electronic device, either directly or indirectly via another component of the device. Circuit board 26 may also incorporate slot 36, which preferably is dimensioned to permit central support tab 38 on frame 28 to be inserted in a clearance fit. When circuit board 26 is coupled to frame 28, central support tab 38 can traverse slot 36 and protrude above the top plane of circuit board 26. Circuit board 26 also can comprise tabs 42a and 42b. When inserted or snapped into slots 44a and 44b of frame 28, tabs 42a and 42b can secure circuit board 26 into frame 28.

In one embodiment of the present invention, central support tab 38 may remain unattached to circuit board 26 at slot 36. By structurally uncoupling the central support tab from the circuit board at the slot, the support tab may be less likely to transfer stress the support tab experiences to the circuit board. In alternative embodiments, central support tab 38 may be attached to circuit board 26 at slot 36, for example, by adhesive or solder deposited in the slot between the support tab and the circuit board or by mechanical clips disposed in the slot that couple the support tab to the circuit board. Other means also may be used to attach the central support tab to the circuit board at slot 36.

As used herein, the term "central support tab" means that the support tab traverses the circuit board via a hole or slot disposed through the circuit board when the electronic device is fully assembled. By no means does the term indicate that the support tab must be located in the center of the circuit board. However, it can be advantageous to incorporate a support tab in the central region of the circuit board because it inherently is the most susceptible to strain. Comparatively, support tabs disposed near the outer perimeter or edges of the circuit board may not provide as great of an advantage as a support tab located near the central region because the device usually is stiffer near the side wall.

Figure 3A:
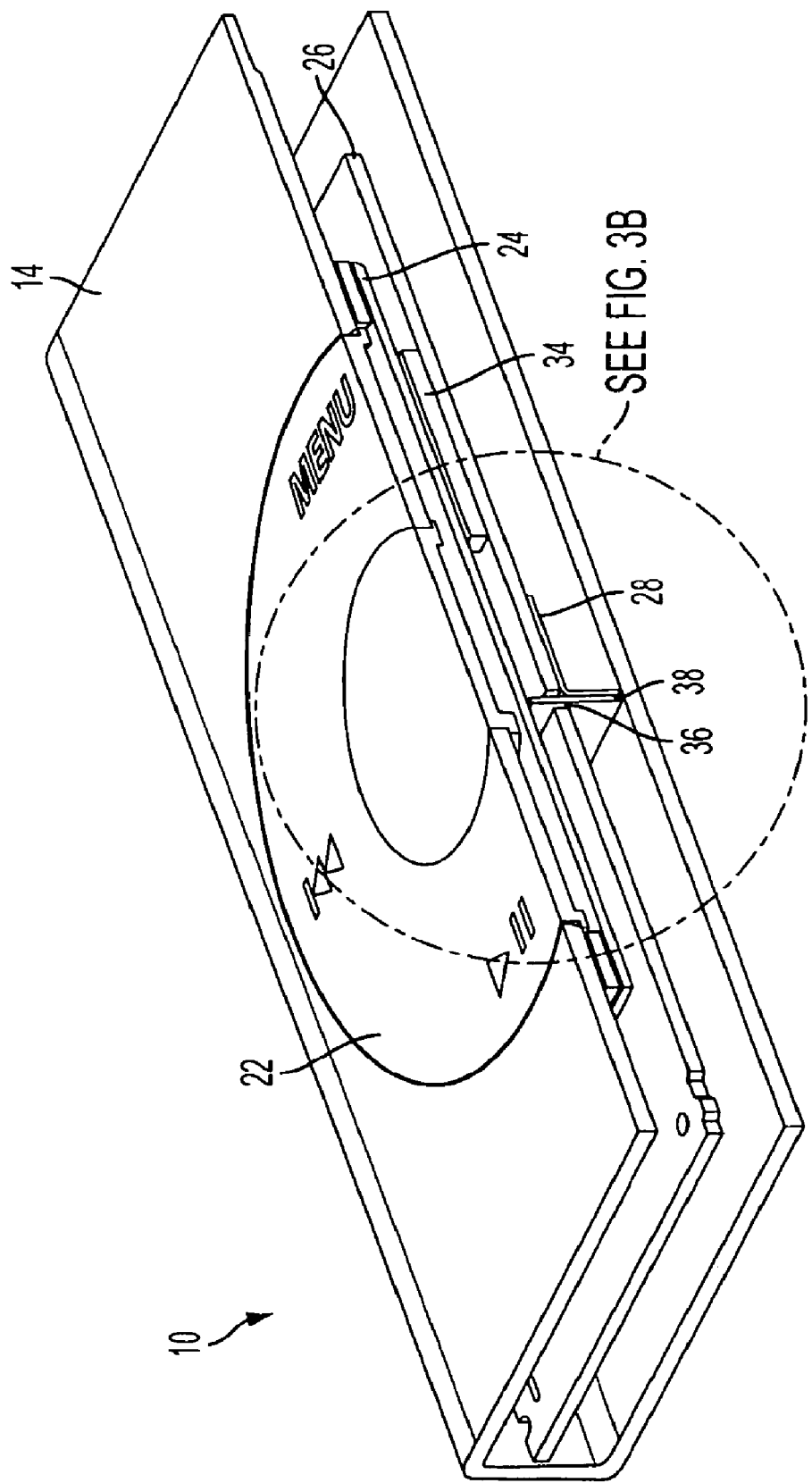
FIG. 3A illustrates a section view of the electronic device of FIG. 1A, incorporating one embodiment of the present invention.
Figure 3B:
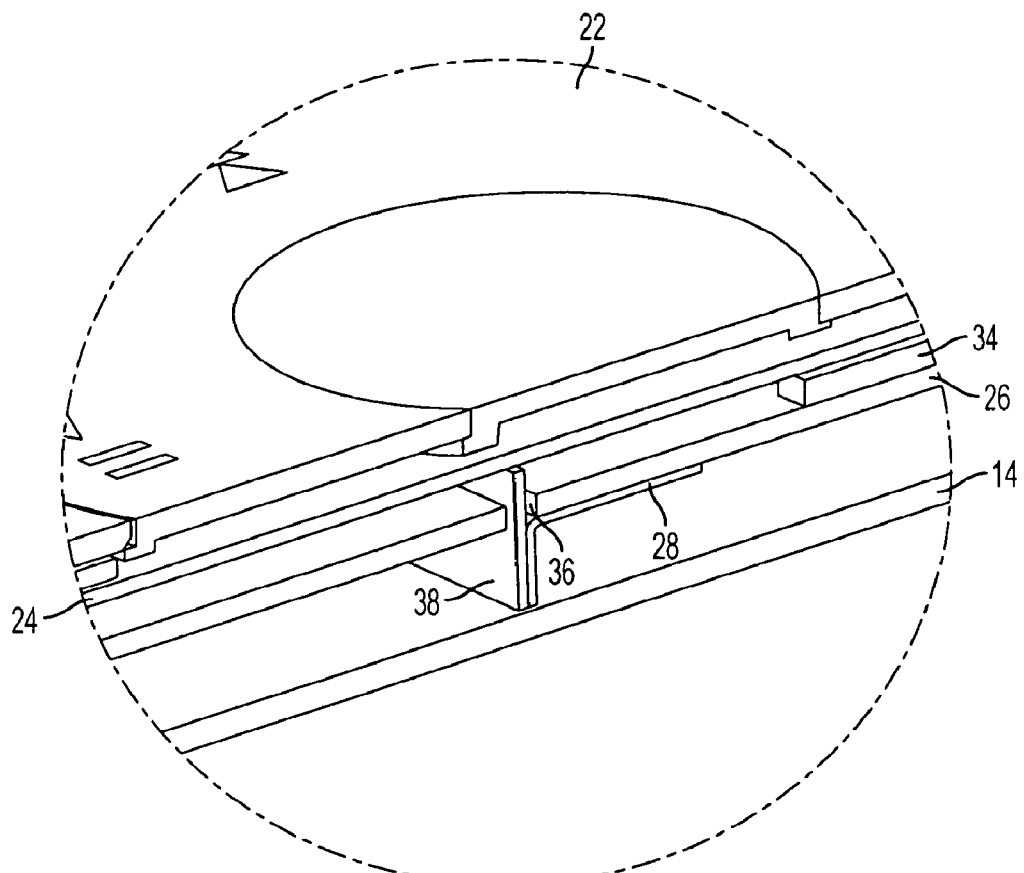
FIG. 3B illustrates an enlarged view of FIG. 3A.

FIGS. 3A and 3B provide a sectional view of the central region of assembly 20 when it is disposed within housing 14 of electronic device 10. As shown in FIGS. 2, 3A, and 3B, support tab 38 can be integral to frame 28. Support tab 38 may have a height that substantially bridges the distance between the bottom wall of housing 14 and stiffener plate 24. When a force is applied to either the top or bottom face of electronic device 10, support tab 38 can buttress housing 14 (in part through stiffener plate 24), reducing the likelihood that housing 14 or stiffener plate 24 will deform enough to damage circuit board 26 and/or components 34. Alternatively, support tab 38 may have a shorter height so that either end of the support tab terminates at an intermediate point between circuit board 26 and a component adjacent to the circuit board. In the later configuration, the support tab may still protect the circuit board by buttressing the housing (either directly or through stiffener plate 24) if a compressive force causes the housing to deform and contact the support tab.

Figure 3D:
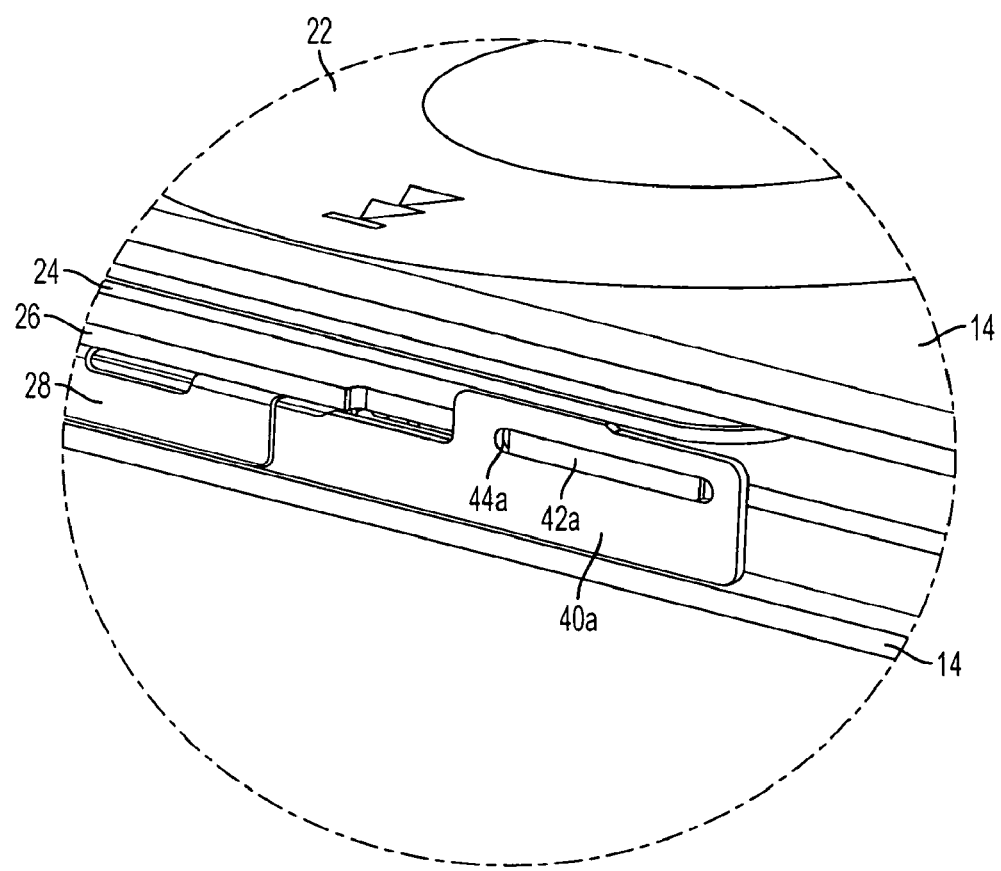
FIG. 3D illustrates an enlarged view of FIG. 3C.

FIGS. 3C and 3D provide a sectional view of the side of assembly 20 when it is disposed in electronic device 10. As shown in FIGS. 2, 3C and 3D, frame 28 can incorporate support tabs 40a and 40b disposed on side struts 29a,b of frame 28, in addition to central support tab 38. In one embodiment of the present invention, side support tabs 40a,b may be disposed at the ends of the first and second side struts. Because side struts 29a,b structurally may be more sound at side support tabs 40a,b, slots 44a,b may be disposed through the side support tabs. In alternative embodiments of the present invention, side support tabs 40a,b and slots 44a,b can be disposed at other locations on the side struts of the frame.

Support tabs 40a,b may share a common height with central support tab 38. In one embodiment of the present invention, the support tabs may share a common height that substantially bridges the distance between the bottom wall of housing 14 and stiffener plate 24. Alternatively, side support tabs 40a,b may have a different height than that of central support tab 38 and/or each other. This may occur, for example, when other components of the electronic device are disposed between one of the support tabs and the housing, but not between the other support tabs and the housing. Regardless of the heights of the support tabs, however, side support tabs 40a and 40b can buttress housing 14 (in part through stiffener plate 24) when an external compressive force is applied to electronic device 10.

As used herein, the term "side support tab" means that the support tab is disposed to resist compressive forces applied to the electronic device without requiring a hole or slot to be provided through the circuit board when the circuit board is attached to the frame. By no means does the term indicate that the support tab must be disposed at or near the edge of the circuit board.

In alternative embodiments of the present invention, slots 44a,b can be disposed at other locations on the frame rather than through support tabs 40a,b. Also, while circuit board 26 of FIGS. 2, 3C, and 3D is designed to be snapped into slots 44a,b in frame 28, the circuit board also can be attached to the frame in a different manner known in the art or otherwise.

Frame 28 can serve an assembly function as well as a protective function for circuit board 26. Many of the internal electronic components of electronic device 10, e.g., the circuit board, the battery, and the display, may be pre-assembled to the frame and then inserted into the housing of the device.

Figure 3E:
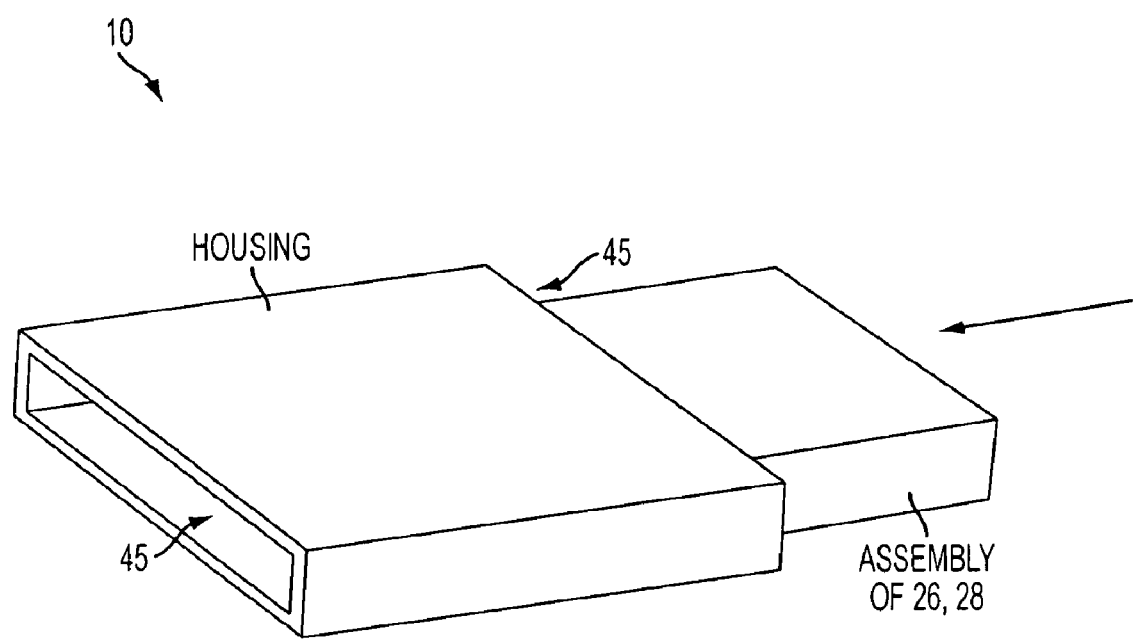
FIG. 3E illustrates "blind" assembly of some of the components of the electronic device into a housing in accordance with the present invention.

Preassembly of the components to frame 28 can facilitate manufacturing of device 10, particularly in "blind" assembly situations explained in greater detail below with respect to FIG. 3E. Once the frame is residing within the housing of the device, central support tab 38 and side support tabs 40a and 40b can protect the device from externally applied forces.

Advantageously, the first embodiment of the present invention can facilitate manufacturing electronic devices having certain housing designs. For example, the electronic device may be designed so that it may be more desirable to insert circuit board 26 and other components of the device into one or more openings 45 disposed on the sides (e.g., opposite ends) of the housing (see, e.g., FIG. 3E). This can make it more difficult to incorporate support tabs into the electronic device when the circuit board and the other components are inserted "blind" into a housing. By disposing one or more support tabs 38 on frame 28 and pre-assembling the circuit board to the frame prior to insertion into the housing, the electronic device can obtain some protection from externally applied forces while still permitting components to be inserted "blind" into one end of the housing.

Referring now to FIGS. 4A and 4B, a second embodiment of the present invention is provided that also facilitates "blind" assembly of components into a housing of an electronic device. The embodiment of FIGS. 4A and 4B can comprise housing 46 of an electronic device having support tab 48 either manufactured with the housing or separately manufactured and coupled to the housing. Like the housing shown in FIG. 3E, housing 46 may incorporate openings 50 to permit internal electronic components of electronic device 10, e.g., an assembly of circuit board 52, battery (not shown), display (not shown), and frame 56, to be slid into the housing during manufacturing.

Circuit board 52 can comprise edge slot 54 through which support tab 48 slides when the circuit board is inserted into housing 46 via opening 50. Edge slot 54 may be sufficiently wide to permit a clearance fit with respect to support tab 48. Similar to central support tab 38 of FIGS. 2-3B, support tab 48 also can be attached or unattached to circuit board 52 at edge slot 54. As used herein, the term "edge slot" means that a surface of the slot is contiguous with a surface surrounding the perimeter of the circuit board.

In one embodiment, support tab 48 may have a height that bridges the distance between the bottom wall of housing 46 to which the support tab is coupled and the component adjacent to circuit board 52, e.g., the top wall of housing 46 or a stiffener plate for a user input assembly. Support tab 48 also may have a shorter height that spans the distance from the bottom wall of housing 46 to an intermediate point between circuit board 52 and a component adjacent to the circuit board. In the later configuration, the support tab can still protect the circuit board by buttressing the housing (either directly or through components disposed between the housing and the circuit board) when a compressive force may cause the housing to deform and contact the support tab. Support tab 48 also may be located at alternative positions within the electronic device, e.g., coupled to the top wall of housing 46 rather than the bottom wall.

FIGS. 5A-F show a third embodiment of the present invention that can have support posts that facilitate assembly of components into clamshell housings. The third embodiment can include housing 58 having bottom piece 58a and top piece 58b, support tab 60, circuit board 62, and other components of an electronic device (not shown). Circuit board 62 can comprise slot 64 through which support tab 60 can be disposed within the housing.

Support tab 60 may be manufactured with either bottom piece 58a or top piece 58b of housing 58 or separately manufactured and then attached to either bottom piece 58a or top piece 58b. In the embodiment of FIG. 5B, support tab 60 may have a height that bridges the distance between bottom piece 58a of housing 58 to which the support tab is affixed and a component adjacent to circuit board 62, e.g., top piece 58b of housing 58 or a stiffener plate for a user input assembly. In alternative embodiments, support tab 60 may have a shorter height that spans the distance from bottom piece 58a of housing 58 to an intermediate point between the top surface of components 66 and a component adjacent to circuit board 62. In the later configuration, the support tab can still protect the circuit board by buttressing the housing (either directly or through components disposed between the housing and the circuit board) when a compressive force may cause the housing to deform and contact the support tab. In the embodiment of FIG. 5C, support tab 60 may have a height that bridges the distance between top piece 58b to which the support tab is affixed and a component adjacent to circuit board 62, e.g., bottom piece 58a of housing 58.

Figure 5A:
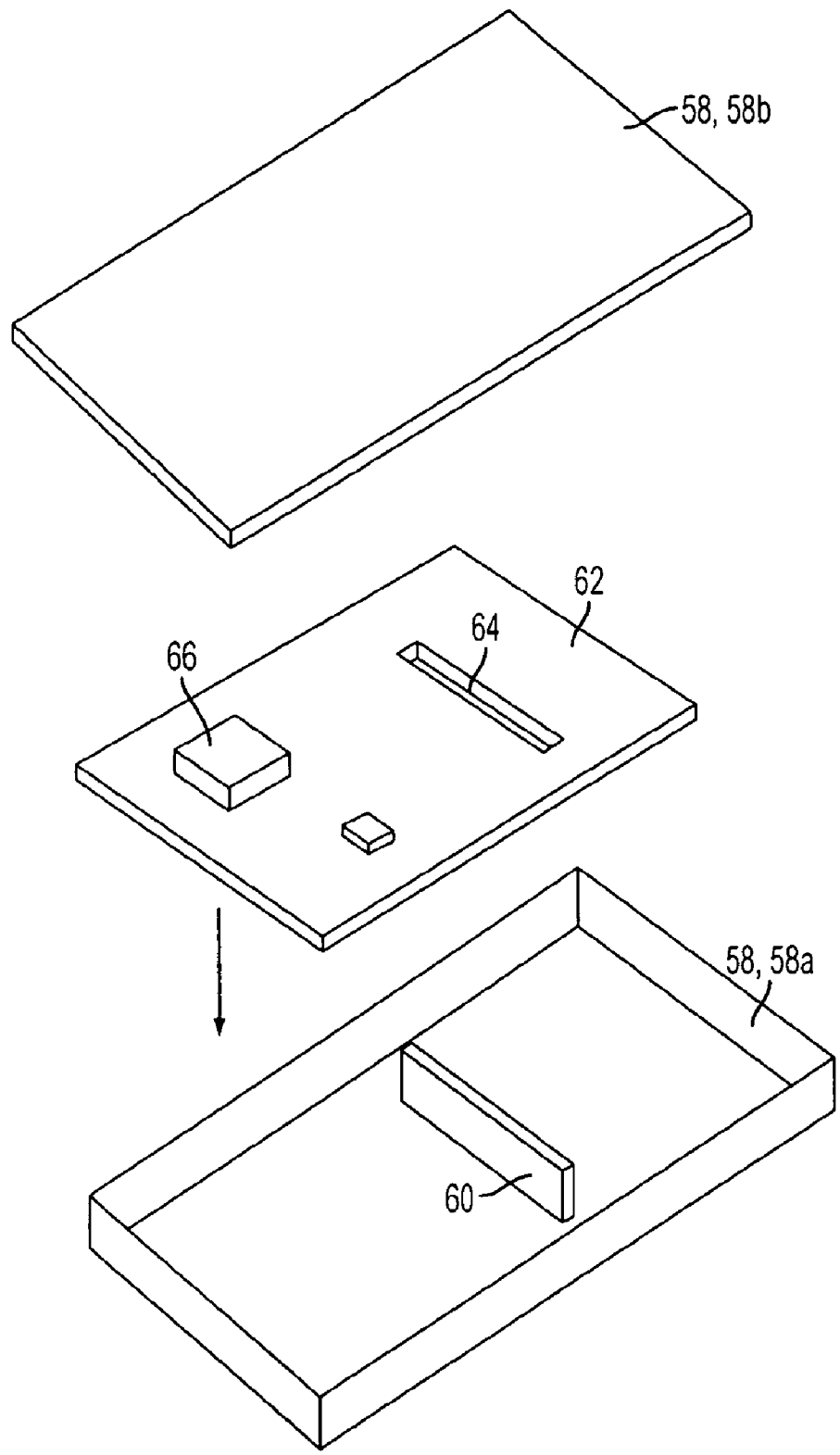
FIGS. 5A-F illustrate a third embodiment of the present invention.
Figure 5B:
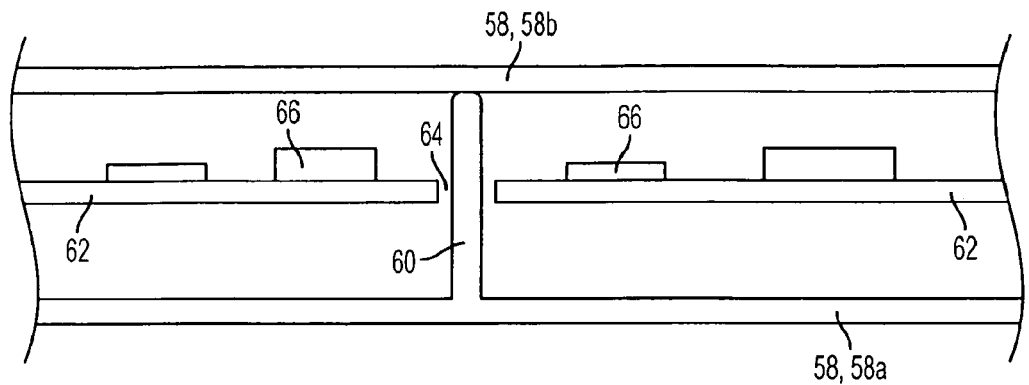
Figure 5C:
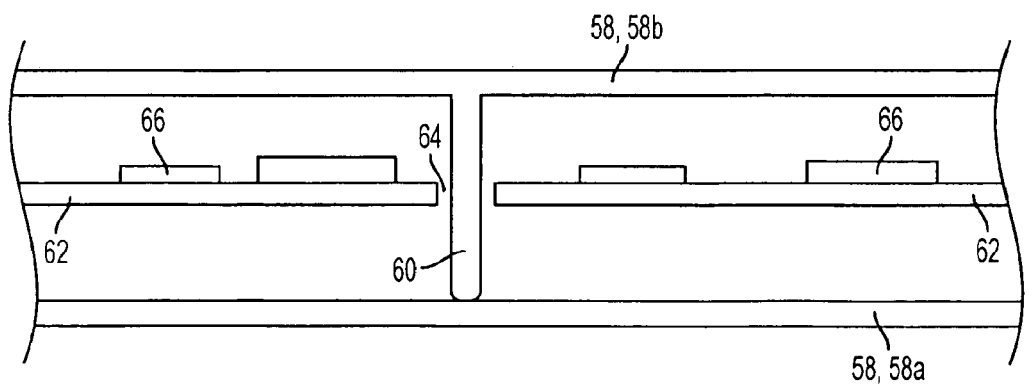
Figure 5D:
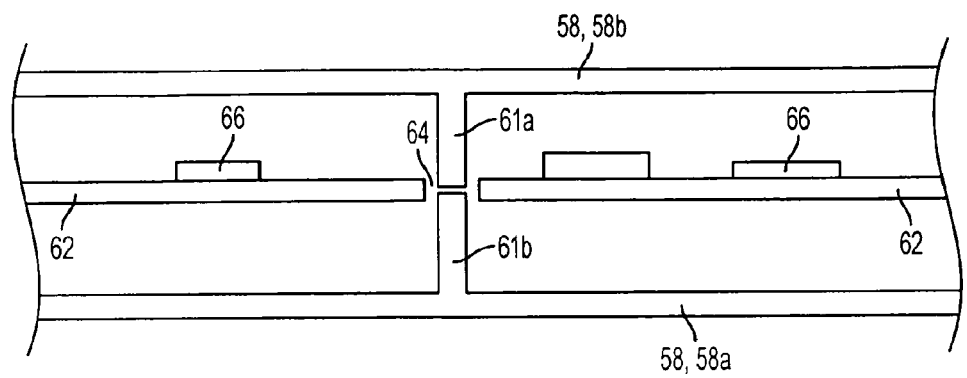
Figure 5E:
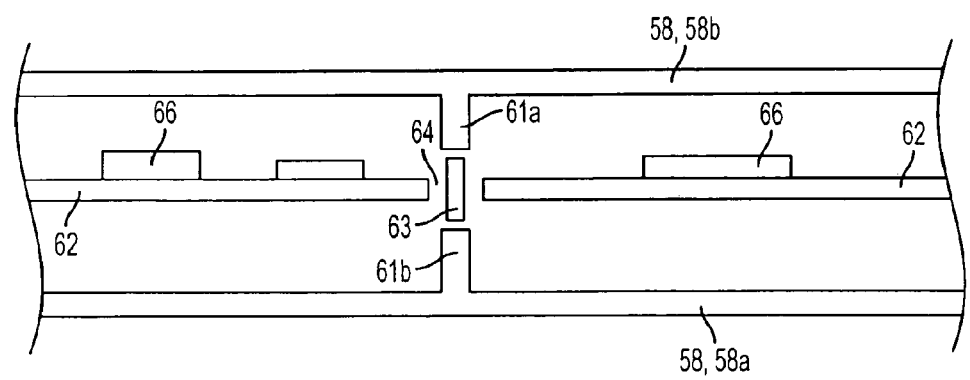
Figure 5F:
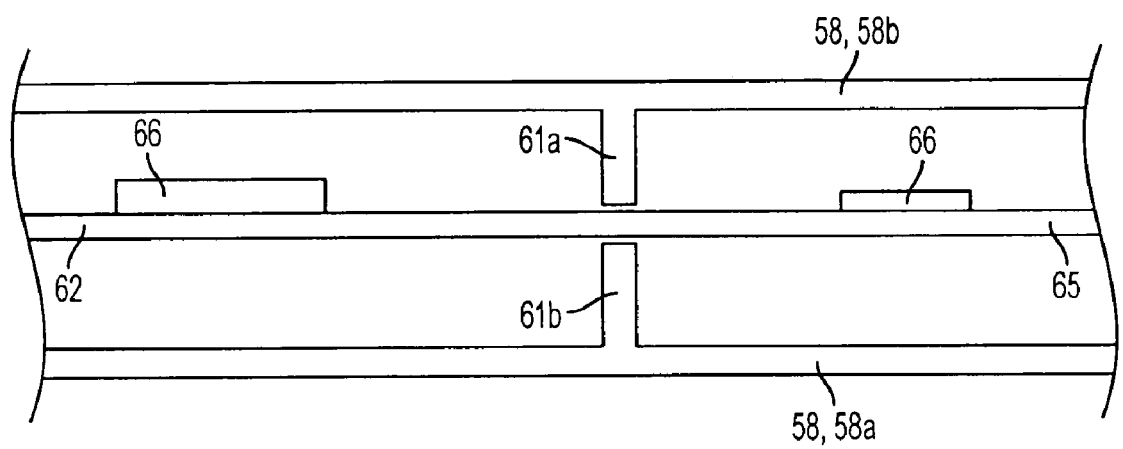

FIGS. 5D-F show alternative embodiments of the present invention that may be similar to the embodiments illustrated in FIGS. 5A-C. Rather than having a support tab disposed from the top or bottom piece of the housing only, support tabs 61a and 61b may be disposed from both the top and bottom pieces of the housing. For example, top piece 58b of housing 58 may incorporate top support tab 61a, which descends from the top piece of the housing. Bottom piece 58a of housing 58 may incorporate bottom support tab 61b, which rises from the bottom piece of the housing.

In the embodiment of FIG. 5D, top support tab 61a and bottom support tab 61b can be disposed in series so that the sum of the heights of both support tabs bridge the distance between bottom piece 58a and top piece 58b. When support tabs 61a,b are disposed in series, support tabs 61a,b effectively can form a single support tab disposed between top and bottom pieces 58a,b through slot 64 of the circuit board. Top support tab 61a and bottom support tab 61b can meet within slot 64 of circuit board 62. Alternatively, the top and bottom support tabs can meet within housing 58 at a location that is above or below the circuit board.

In the embodiment of FIG. 5E, top support tab 61a and bottom support tab 61b can protrude from respective top and bottom pieces of the housing to meet central support tab 64. Central support tab 64 may be disposed on a frame to which circuit board 62 may be coupled, e.g., frame 28 of FIG. 2. By disposing multiple support tabs in series, the sum of the heights of all of the support tabs bridge the distance between bottom piece 58a and top piece 58b of housing 58.

Slot 64 of circuit board 62 may be designed to provide a clearance fit for support tabs 60, 61a, or 61b when circuit board 62 is disposed within housing 58. The support tabs can be attached or unattached to circuit board 62 at slot 64.

FIG. 5F illustrates an embodiment of the present invention that is similar to that shown in FIG. 5E, except that central support tab 63 of FIG. 5E may be replaced with circuit board 65. Top support tab 61a and bottom support tab 61b can protrude from respective top and bottom pieces of the housing to meet top and bottom surfaces of circuit board 65. By disposing top and bottom support tabs 61a and 61b in series between circuit board 62 and top and bottom pieces 58b and 58a (respectively), the sum of the heights of the support tabs and the thickness of circuit board 65 bridge the distance between bottom piece 58a and top piece 58b of housing 58.

Figure 6A:
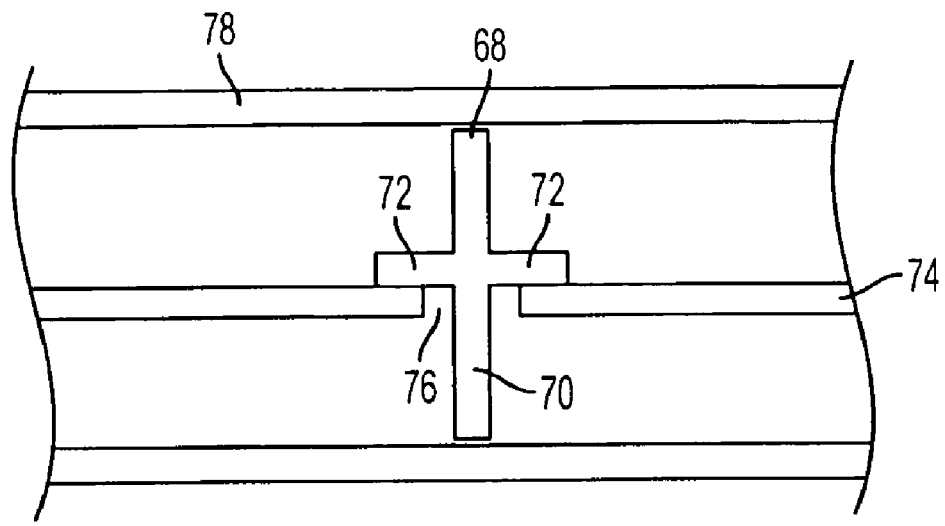
FIGS. 6A and 6B illustrate fourth and fifth embodiments of the present invention.

FIG. 6A shows a fourth embodiment of the present invention. The main difference between the embodiment of FIG.

6A and the embodiments described above with respect to FIGS. 2-5C is that support tab 68 of FIG. 6A can be attached to circuit board 74, and not a frame or housing of the electronic device. Support tab 68 can comprise trunk 70 and one or more flanges 72. Support tab 68 can be affixed to circuit board 74 via flanges 72 by adhesive, solder, screws, or other means known in the art or otherwise. Circuit board 74 can comprise through-hole 76 through which a portion of trunk 70 may be disposed once the support tab is affixed to the circuit board. Through-hole 76 may provide a clearance fit for the support tab. Support tab 68 may have a height that bridges the distance between components of the electronic device adjacent to circuit board 74, e.g., one or more walls of housing 78 and/or a stiffener plate for a user input assembly. Alternatively, support tab 68 may have a shorter height so that either end of the support tab terminates at an intermediate point between circuit board 74 and components adjacent to the circuit board. In the later configuration, the support tab may still protect the circuit board by buttressing the housing (either directly or through components disposed between the housing and the circuit board) when a compressive force may cause the housing to deform and contact the support tab.

Figure 6B:
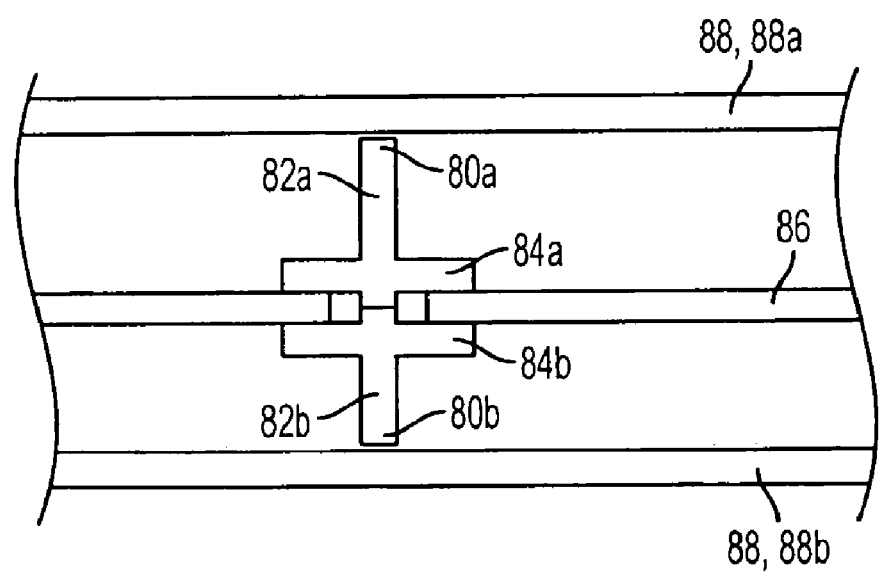

FIG. 6B illustrates a fifth embodiment of the present invention, similar to that of FIG. 6A. The main difference between the embodiments shown in FIG. 6B and 6A is that circuit board 86 of FIG. 6B can be supported by two tabs 80a and 80b that together serve the function of support tab 68 of FIG. 6A. In particular, each support tab 80a,b respectively may comprise trunk 82a, 82b and one or more flanges 84a, 84b by which each support tab is affixed to the circuit board. When support tabs 80a and 80b are attached to opposite surfaces of circuit board 86, support tab 80a can buttress top wall 88a of housing 88 while support tab 80b can buttress bottom wall 88b of housing 88 to protect circuit board 86 from externally applied forces. One of ordinary skill in the art will understand that there may be intervening components disposed between circuit board 86 and the top and/or bottom walls of housing 88. In that case, the supporting tabs can buttress the housing through those intervening components to protect the circuit board from damage.

Although particular embodiments of the present invention have been described above in detail, it will be understood that this description is merely for purposes of illustration. Alternative embodiments of those described hereinabove also are within the scope of the present invention. For example, a support tab of the present invention may comprise any cross-sectional shape, e.g. rectangular, circular, T-shaped, square, irregular, etc. Indeed, the cross-section of the support tab may vary along the height of the support tab. For example, the support tab may have indentations, holes, insets, and/or cutouts to accommodate other components of the electronic device when space is at a premium. Alternatively, support tabs can be used as a structural brace for other components in the device. The other components can be coupled to the support tab at indentations, slots, or cutouts in the support tab. Each support tab also may comprise shoulder-screws or have a tip on one or both ends of the tab so that the tabs resemble pins.

While the description of the embodiments presented herein may refer to holes or slots within the circuit boards through which central support tabs may be disposed, the term "hole" may be used interchangeably with the term "slot." Neither term is intended to indicate any particular cross-sectional shape. As used herein, the term "hole" may be a cutout having any cross-sectional shape. Examples can include circular holes, polygonal slots, edge slots similar to slot 54 of FIG. 4A, or any other suitable configuration.

While some of the embodiments of support tabs described herein incorporate one central support tab, additional support tabs may be incorporated in a central region of the circuit board/electronic device or along edges of the circuit board/electronic device.

Each support tab also may be manufactured with the frame or housing on which it is disposed. Alternatively, each support tab may be manufactured separately from the frame or housing and subsequently attached. Attachment can be accomplished by methods known in the art or otherwise, including soldering, adhering, or screwing the components together.

Additionally, combinations of the above-described embodiments of the present invention or portions thereof may be provided in one electronic device unit. For example, an electronic device can incorporate side support tabs along with any of the other support tabs described hereinabove.

One of ordinary skill in the art will understand that, while certain embodiments described above facilitate certain manufacturing techniques (e.g., "blind" assembly or clamshell assembly) and/or housing designs, those embodiments are not necessarily limited thereto. For example, while the embodiment of FIGS. 2-3D facilitate "blind" assembly of components into the electronic device housing, that embodiment of the present invention also may be used when a clamshell housing is more desirable. The present invention also may be incorporated into an electronic device having housings in which the main body of the housing includes multiple parts. An example of such a multi-part housing includes a clamshell housing. The housing of an electronic device of the present invention also may include housings in which the main body includes only one piece. An example of such a housing includes, e.g., the housings of FIGS. 3A, 3E, and 4A. A housing of the present invention may provide only one opening through which components are inserted or multiple openings that can be disposed, for example, on multiple sides of the housing.

The present invention can be incorporated in any electronic device, including any portable, mobile, hand-held, or miniature consumer electronic device that may require protection from compressive forces applied thereto. Illustrative electronic devices can include, but are not limited to, music players, video players, still image players, game players, other media players, music recorders, video recorders, cameras, other media recorders, radios, medical equipment, calculators, cellular phones, other wireless communication devices, personal digital assistances, programmable remote controls, pagers, laptop computers, printers, or combinations thereof. Miniature electronic devices may have a form factor that is smaller than that of hand-held devices. Illustrative miniature electronic devices can include, but are not limited to, watches, rings, necklaces, belts, accessories for belts, headsets, accessories for shoes, virtual reality devices, other wearable electronics, accessories for sporting equipment, accessories for fitness equipment, key chains, or combinations thereof.

The above described embodiments of the present invention are presented for purposes of illustration and not of limitation, and the present invention is limited only by the claims which follow.

What is claimed is:

1. A frame suitable for coupling to a circuit board, wherein the circuit board has first and second tabs and a hole, the frame comprising:
   first and second side struts, wherein each of the first and second side struts has a hole disposed therethrough;
   a central strut that couples the first and second side struts; and a first support tab disposed on the central strut, wherein the first support tab is configured to pass through the hole in the circuit board and not attach to the circuit board when the circuit board is coupled to the frame.

2. The frame of claim 1, further comprising second and third support tabs.

3. The frame of claim 2, wherein:
the second support tab is disposed on the first side strut; and
the third support tab is disposed on the second side strut.

4. The frame of claim 2, wherein:
the second support tab is disposed at an end of the first side strut; and
the third support tab is disposed at an end of the second side strut.

5. The frame of claim 2, wherein two or more of the first, second, and third support tabs share a common height.

6. The frame of claim 1, wherein the first support tab is disposed in a center position along a length of the central strut.

7. A frame suitable for coupling to a circuit board, wherein the circuit board has first and second tabs and a hole, the frame comprising:
first and second side struts, wherein each of the first and second side struts has a hole disposed therethrough;
a central strut that couples the first and second side struts;
a first support tab disposed on the central strut; and
second and third support tabs, wherein:
the hole in the first side strut is disposed through the second support tab; and
the hole in the second side strut is disposed through the third support tab.

8. A frame suitable for coupling to a circuit board, wherein the circuit board has first and second tabs and a hole, the frame comprising:
first and second side struts, wherein each of the first and second side struts has a hole disposed therethrough;
a central strut that couples the first and second side struts;
a first support tab disposed on the central strut; and
second and third support tabs, wherein none of the first, second, or third support tabs share a common height.

9. A frame suitable for coupling to a circuit board, wherein the circuit board has first and second tabs and a hole, the frame comprising:
first and second side struts, wherein each of the first and second side struts has a hole disposed therethrough;
a central strut that couples the first and second side struts; and
a first support tab disposed on the central strut, wherein the hole in the first side strut is suitable for coupling to the first tab on the circuit board.

10. The frame of claim 9, wherein the hole in the second side strut is suitable for coupling to the second tab on the circuit board.

11. A frame suitable for coupling to a circuit board, wherein the circuit board has a first tab and a second tab, the frame comprising:
a first side strut comprising a first hole disposed therethrough;
a second side strut comprising a second hole disposed therethrough; and
a central strut coupling the first and second side struts, wherein the first hole is configured to receive the first tab of the circuit board.

12. The frame of claim 11, wherein the first hole is configured to have the first tab of the circuit board inserted into the first hole.

13. The frame of claim 11, wherein the first hole is configured to have the first tab of the circuit board snapped into the first hole.

14. The frame of claim 11, wherein the second hole is configured to receive the send tab of the circuit board.

15. The frame of claim 14, wherein the second hole is configured to have the second tab of the circuit board inserted into the second hole.

16. The frame of claim 14, wherein the second hole is configured to have the second tab of the circuit board snapped into the second hole.

17. The frame of claim 11 further comprising a first support tab disposed on the central strut.

18. The frame of claim 17, wherein the first support tab is configured to be disposed through a hole in the circuit board when the first hole of the frame has received the first tab of the circuit board.

19. A frame suitable for coupling to a circuit board within a housing, the frame comprising:
a central strut; and
a first support tab disposed on the central strut, wherein the first support tab is configured to pass through a hole in the circuit board and protrude above the circuit board for buttressing the housing when the circuit board is coupled to the frame.

20. The frame of claim 19 further comprising:
a first side strut; and
a second side strut, wherein the central strut couples the first and second side struts.

21. The frame of claim 19, wherein the first side strut comprises a first hole for receiving a first tab of the circuit board when the circuit board is coupled to the frame.

22. The frame of claim 21, wherein the second side strut comprises a second hole for receiving a second tab of the circuit board when the circuit board is coupled to the frame.

* * * * *